United States Patent
Uetake et al.

(10) Patent No.: US 9,330,786 B2
(45) Date of Patent: May 3, 2016

(54) SEMICONDUCTOR DEVICE, TEST METHOD THEREOF, AND SYSTEM

(75) Inventors: Satoshi Uetake, Tokyo (JP); Yuji Uo, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 1502 days.

(21) Appl. No.: 13/012,360

(22) Filed: Jan. 24, 2011

(65) Prior Publication Data

US 2011/0184688 A1     Jul. 28, 2011

(30) Foreign Application Priority Data

Jan. 28, 2010   (JP) .................................. 2010-016890

(51) Int. Cl.
    *G01R 31/28*     (2006.01)
    *G11C 29/40*     (2006.01)
    *G11C 5/04*     (2006.01)

(52) U.S. Cl.
    CPC *G11C 29/40* (2013.01); *G11C 5/04* (2013.01); *H01L 2224/16* (2013.01); *H01L 2924/1305* (2013.01)

(58) Field of Classification Search
CPC combination set(s) only.
See application file for complete search history.

(56) References Cited

U.S. PATENT DOCUMENTS

| | | |
|---|---|---|
| 2004/0257847 A1 | 12/2004 | Matsui et al. |
| 2006/0126404 A1 | 6/2006 | Sohn et al. |
| 2007/0109887 A1* | 5/2007 | Baker ............... G11C 29/40 365/201 |
| 2010/0052724 A1* | 3/2010 | Mizuno ............ G01R 31/31703 324/750.3 |

FOREIGN PATENT DOCUMENTS

| | | |
|---|---|---|
| JP | 09-259600 A | 10/1997 |
| JP | 2000-33997 A | 12/2000 |
| JP | 2001-006395 A | 1/2001 |
| JP | 2004-327474 A | 11/2004 |

* cited by examiner

*Primary Examiner* — Guerrier Merant

(57) ABSTRACT

A semiconductor device includes a plurality of chips comprising a plurality of I/O terminals connected in common via through electrodes. Each of the chips includes an I/O compression circuit operable to output a compression result obtained by compression of data of a plurality of internal data buses to a first I/O terminal of the plurality of I/O terminals. Each of the chips also includes a test control circuit having a register group that sets the number of the first I/O terminal. Setting information that assigns different first I/O terminals to different chips is set in the register group. Each of the chips inputs or outputs data with use of the number of the I/O terminal that is different from those in other chips. Thus, the I/O compression circuits can concurrently perform an I/O compression test in parallel in the plurality of chips without a bus fight.

17 Claims, 12 Drawing Sheets

[TEST TABLE OF CASE 2]

| SEMICONDUCTOR DEVICE | Reg.3 TSW32, TSW8-i |
|---|---|

TSV NUMBER: 0 1 2 3 4 5 6 7 8 9 10 11 12 13 14 15 16 17 18 19 20 21 22 23 24 25 26 27 28 29 30 31

[WRITING] (INPUT PIN SETTING)
- LAYER 7: 111 — h
- LAYER 6: 110 — g
- LAYER 5: 101 — f
- LAYER 4: 100 — e
- LAYER 3: 011 — d
- LAYER 2: 010 — c
- LAYER 1: 001 — b
- LAYER 0: 000 — a

[READING] (OUTPUT PIN SETTING)
- LAYER 7: 111
- LAYER 6: 110
- LAYER 5: 101
- LAYER 4: 100
- LAYER 3: 011
- LAYER 2: 010
- LAYER 1: 001
- LAYER 0: 000

EXTERNAL TERMINAL NUMBER OF STACKED PACKAGE

TESTER DEVICE

SEMICONDUCTOR DEVICE, TEST METHOD THEREOF, AND SYSTEM

This application claims the benefit of priority from Japanese patent application No. 2010-16890, filed on Jan. 28, 2010, the disclosure of which is incorporated herein in its entirety by reference.

BACKGROUND

1. Field of the Invention

The present invention relates to a semiconductor device, a test method of a semiconductor device, and a system including the semiconductor device.

2. Description of the Related Art

Semiconductor devices having a storage function, e.g., semiconductor memory devices, have been developed so as to increase the degree of integration and the capacity. One of techniques for increasing the degree of integration and the capacity includes stacking a plurality of chips (memory chips) on an I/O chip and connecting the plurality of chips stacked on the I/O chip to each other via through electrodes (TSV: through silicon via), which penetrate the chips in the thickness direction thereof (Patent Document 1: US 2004/0257847 A1). Another technique is a dual die package (DDP) technique in which two chips having the same structure (i.e., two memory dies) are stacked in one package (Patent Document 2: US 2006/0126404 A1).

Meanwhile, an operation test of examining whether all of memory cells correctly work in a semiconductor memory device is required to be performed after packaging (assembly process) in which chips are sealed by molding or the like before the shipment of the semiconductor memory device. As the storage capacity increases, the operation test needs more time. Therefore, it has been desired to shorten a period of an operation test (test period).

An I/O compression test function mounted on a single chip has been used in order to reduce not only a period of an operation test, but also the number of drives and comparators in a tester device, which is a tool for examining a semiconductor device, or in a controller mounted on a motherboard for controlling a semiconductor device. Drivers are means for writing data in memory cells of a semiconductor device from a tester device via TSVs of the semiconductor device during an operation test. Comparators are means for judging, during the operation test, whether signal outputs (logics of signals) that have been read from the memory cells and transmitted to the exterior of the semiconductor device via the TSVs identical with expectations of the tester device. Furthermore, the I/O compression test function is a function of simultaneously inputting (writing) data into a plurality of I/O lines (internal data buses) of each chip from a specific I/O terminal of a plurality of I/O terminals in a semiconductor device and outputting the logical AND of the data of the I/O lines to the specific I/O terminal.

Patent Document 3 (JP-A 9-259600) discloses this type of operation test time-reduction technique, in which a chip has a data compression test mode of compressing reading data and outputting the compressed data.

SUMMARY

The present inventors have recognized the following points. In a semiconductor device in which a plurality of chips are stacked and packaged by using the aforementioned technique such as TSV or DDP, I/O terminals of the semiconductor device and I/O terminals (chip terminals) of respective chips are connected in common, and, for example, the I/O terminals of the chips are connected to external terminals of the semiconductor device. Therefore, an I/O compression test cannot be performed concurrently on the respective chips. In other words, a tester device (or a controller) cannot perform an I/O compression test concurrently on a plurality of chips via chip terminals of the chips, which are connected in common to one external terminal (I/O terminals) of the semiconductor device. This is because I/O compression test results of different chips are subjected to a common connection in a package. Specifically, for example, if the chips respectively use an I/O compression test function and output a test result to the corresponding chip terminal, a bus fight occurs on a plurality of I/O compression test results at the same point of time because those chip terminals are electrically connected in common by the TSV. Therefore, the respective chips need to perform an I/O compression test in time sequence. Thus, the test period increases in proportion to the number of the chips. Furthermore, the number of drives and comparators of a tester device (or a controller) increases as the number of the I/O terminals increases.

According to a first aspect of the present invention, a semiconductor device comprising first and second chips is provided. In the semiconductor device, a plurality of I/O terminals of the first chip and a plurality of I/O terminals of the second chip are connected in common. Each of the first and second chips includes an I/O compression circuit operable to output a compression result obtained by compression of data of a plurality of internal data buses to a first I/O terminal of the plurality of I/O terminals in a test mode, and a test control circuit operable to control the I/O compression circuit. The test control circuit comprises a number setting register operable to set the number of the first I/O terminal of the plurality of I/O terminals so that the number of the first I/O terminal of the first chip is different from the number of the first I/O terminal of the second chip. Each of the first and second chips is operable to concurrently input data from or output data to an exterior or an interior of the semiconductor device in parallel so that different first I/O terminals are used in different chips with the I/O compression circuit activated in the test mode by the test control circuit.

According to a second aspect of the present invention, an I/O compression test method of a semiconductor device including a first chip and a second chip is provided. A plurality of I/O terminals of the first chip and a plurality of I/O terminals of the second chip are connected in common and connected to a plurality of external I/O terminals of the semiconductor device for external communication. The I/O compression test method comprises recognizing or setting first and second information different from each other in the first and second chips after supplying power to the semiconductor device, concurrently accessing the first and second chips, which are accessed under exclusive control in a non-test mode, in a test mode, and concurrently making a first comparison and a second comparison in parallel. The first comparison includes comparing a first test result, which is to be outputted to a first I/O terminal selected with the first information by the first chip, with an expected value outside of the semiconductor device via a first external I/O terminal of the plurality of external I/O terminals. The second comparison includes comparing a second test result, which is to be outputted to a second I/O terminal selected with the second information by the second chip, with an expected value outside of the semiconductor device via a second external I/O terminal that is different from the first external I/O terminal of the plurality of external I/O terminals.

According to a third aspect of the present invention, a system comprising a semiconductor device and a controller connected to the semiconductor device via a command bus and an I/O bus is provided. The semiconductor device comprises first and second chips. In the system, a plurality of I/O terminals of the first chip and a plurality of I/O terminals of the second chip are connected in common. Each of the first and second chips includes an I/O compression circuit operable to output a compression result obtained by compression of data of a plurality of internal data buses to a first I/O terminal of the plurality of I/O terminals in a test mode, and a test control circuit operable to control the I/O compression circuit. The test control circuit comprises a number setting register operable to set the number of the first I/O terminal of the plurality of I/O terminals so that the number of the first I/O terminal of the first chip is different from the number of the first I/O terminal of the second chip. Each of the first and second chips is operable to concurrently input data from or output data to an exterior or an interior of the semiconductor device in parallel so that different first I/O terminals are used in different chips with the I/O compression circuit activated in the test mode by the test control circuit.

According to the above aspects, the following advantageous effects can be attained.

1) An I/O compression test can be performed in parallel concurrently on a plurality of chips including a first chip and a second chip. Therefore, a period of time required for an I/O compression test can be shortened.

2) For example, when an I/O compression test is performed at the highest compression ratio (with use of only one terminal of 32 I/O terminals), only drives and comparators corresponding to such compression are required in a tester device. Therefore, the number of drives and comparators in a tester device can be reduced, and cost reduction can thus be achieved.

BRIEF DESCRIPTION OF THE DRAWINGS

The above features and advantages of the present invention will be more apparent from the following description of certain preferred embodiments taken in conjunction with the accompanying drawings, in which:

FIG. 4 is a diagram explanatory of the relationship of I/O terminals used in a writing operation and I/O terminals used in a reading operation of a 32-data I/O compression test in a semiconductor device according to an embodiment of the present invention, external terminals of the semiconductor device, and terminals of a tester device;

FIG. 5 is a diagram explanatory of the relationship of I/O terminals used in a writing operation and I/O terminals used in a reading operation of an 8-data I/O compression test in a semiconductor device according to an embodiment of the present invention, external terminals of the semiconductor device, and terminals of a tester device;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

According to a first embodiment of the present invention, a semiconductor device having a plurality of memory chips is provided. The memory chips have a plurality of I/O terminals connected in common. Each of the memory chips includes an I/O compression circuit unit having an I/O compression test function after packaging of the semiconductor device and a test control circuit having a register group for assigning the I/O compression test function to at least one of the plurality of I/O terminals. Information for assigning one or more different I/O terminals to different memory chips is set in the register group of each of the memory chips. Thus, the memory chips can concurrently perform the I/O compression test function in parallel via the one or more different I/O terminals.

That is, in the semiconductor device, an I/O compression technique is used so that different I/O terminals are used in different memory chips for input and output of compressed data during an I/O compression test.

Preferred embodiments of the present invention will be described in detail with reference to the accompanying drawings.

Embodiments

Figure 10:
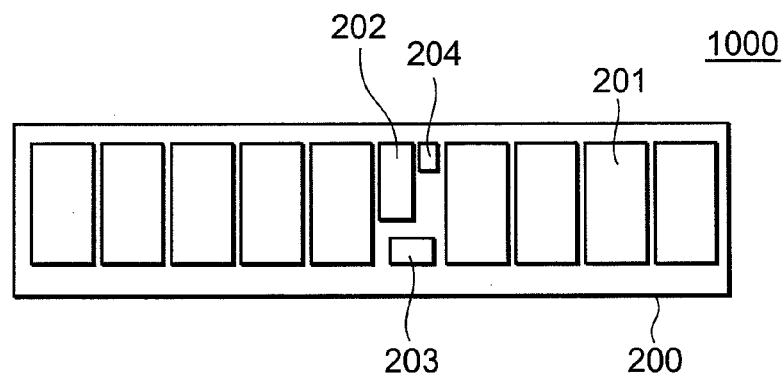
FIG. 10 is a diagram showing a planar-arrangement type semiconductor device as an example of a semiconductor device to which the present invention is applicable.
Figure 11:
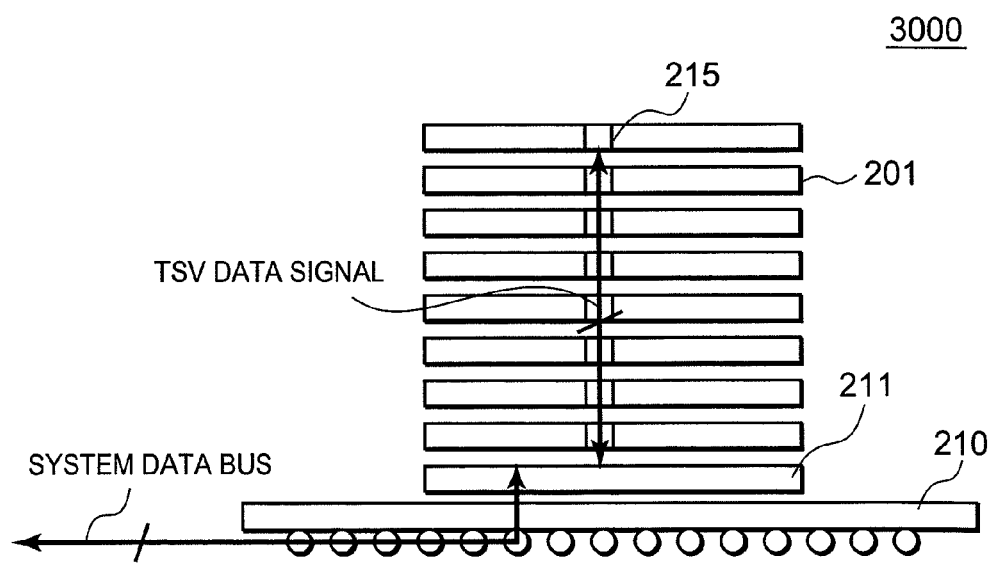
FIG. 11 is a diagram showing an overview of a stack type semiconductor device as another example of a semiconductor device to which the present invention is applicable.
Figure 12:
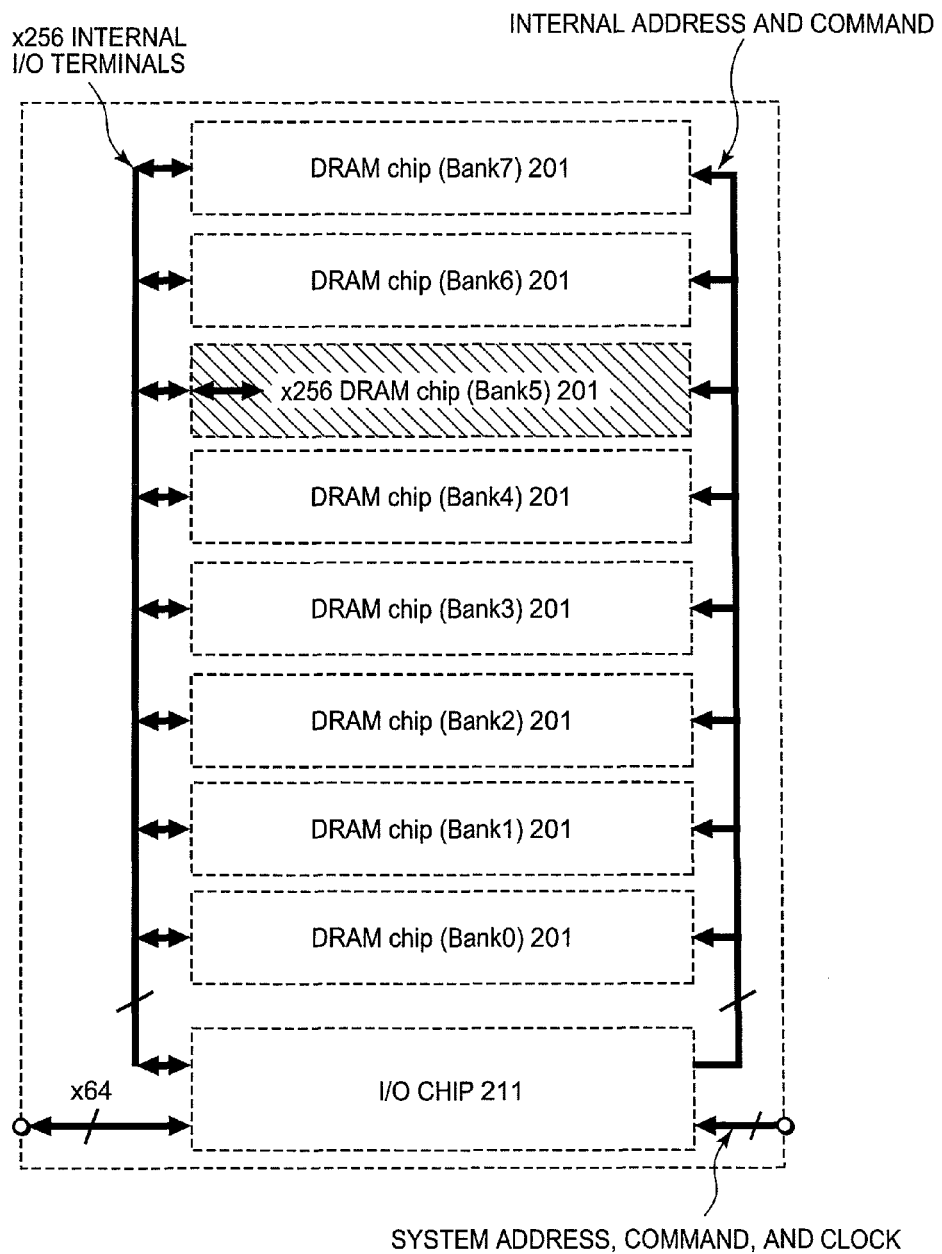
FIG. 12 is a diagram showing an overview of a semiconductor device having eight stacked memory chips as another example of a stack type semiconductor device to which the present invention is applicable.

For understanding the present invention, some examples of semiconductor devices 1000 and 3000 to which the present invention is applicable will be described with reference to FIGS. 10, 11, and 12 prior to explanation of embodiments of the present invention. Examples shown in FIGS. 10, 11, and 12 are disclosed in Patent Document 1. As a matter of course, any of those examples is merely for understanding the present invention and never imposes any restriction on the scope of the present invention.

With reference to FIG. 10, a memory subsystem, i.e., a memory module (semiconductor device) will be summarized as a first example to which the present invention is applicable. A memory module 1000 shown in FIG. 10 includes a module substrate 200, a plurality of dynamic random access memory (DRAM) chips 201, which are two-dimensionally arranged in parallel, a register 202 disposed near a central portion of the module substrate 200, a phase locked loop (PLL) circuit 203, and a serial presence detect (SPD) 204. The example shown in FIG. 10 includes nine DRAM chips. The DRAM chips 201, the register 202, the PLL circuit 203, and the SPD 204 are mounted on the module substrate 200. The module substrate 200 is mounted on a motherboard (not shown) with a connector (not shown). In addition to the illustrated memory module, other memory modules are also mounted on the motherboard along with a chip set (memory controller). Those memory modules and the chip sets constitute a memory system.

Module data lines are provided in a downward direction of FIG. 10, or along a short side of the module substrate 200, from the DRAM chips 201. Module command/address lines are provided in the downward direction of FIG. 10 from the register 202. A module clock line extends along the downward direction of FIG. 10 from the PLL circuit 203. The module command/address line and the module clock line are connected to connectors arranged along a long side of the module substrate 200. The SPD 204 is a memory that determines operational conditions of the DRAM chips 201 mounted on the module substrate 200. Usually, the SPD 204 is formed by a ROM.

Furthermore, module command/address distribution lines are provided along the long side of the module substrate 200, i.e., in a lateral direction, from the register 202 to the respective DRAM chips 201. Similarly, module clock distribution lines are provided from the PLL circuit 203 to the respective DRAM chips 201.

With the above configuration, the memory module can process, as module data, input/output data having bits corresponding to a bus width of a memory access data bus.

A second example of the memory module (semiconductor device) will be described with reference to FIG. 11. As with the memory module shown in FIG. 10, the memory module 3000 shown in FIG. 11 can process input/output data signals corresponding to a data width of the DRAM chips as a memory data bus width. By forming a stacked structure with a plurality of DRAM chips (eight DRAM chips in this example), the entire memory system can include a plurality of memory subsystems, can increase the memory capacity, and can reduce a packaging area.

In FIG. 11, the memory module 3000 includes an interposer substrate 210, an I/O chip 211 mounted on the interposer substrate 210, and eight DRAM chips 201 stacked on the I/O chip 211. In the following description, the DRAM chips may be referred to as Layer 0 to Layer 7, respectively, in an upward direction from the lowermost DRAM chip adjacent to the I/O chip 211. Layer 0 is a first chip while any one of Layers 1 to 7 is a second chip.

Next, components of the memory module will be described. The I/O chip 211 and the respective DRAM chips 201 are connected to each other via through electrodes, i.e., TSVs 215. Data signals are transmitted to and received from the I/O chip 211 via the TSVs 215. Each of the TSVs 215 is an electrode extending through the DRAM chip 201 from one surface to another for establishing connection between chips. For the purpose of illustration, only one TSV is illustrated in FIG. 11 on each of the DRAM chips 201. However, for example, 72×4 (=288) TSVs made of copper or aluminum are provided.

The interposer substrate 210 is made of silicon. The interposer substrate 210 has ball grid array (BGA) terminals corresponding to the packaging pitches of all signals required on the board to implement a function of a 1-channel memory subsystem, including a system data signal, a system address signal, a system control signal, and a system clock signal. The interposer substrate 210 has a function of connecting each of the signal BGA terminals to each of signal pads on the I/O chip, which is formed of a silicon chip, by using substrate lines and bumps.

The I/O chip 211 has a function of reconfiguring signals inputted from the chip sets in order to operate the DRAM chips 201, a function of transmitting signals to the DRAM chips 201 via terminals of the TSVs 215, a function of receiving signals from the DRAM chips 201 via the terminals of the TSVs 215, and a function of reconfiguring data signals received from the DRAM chips 201 and transmitting the reconfigured data signals as system data signals to the exterior of the I/O chip 211.

The BGA terminals of the interposer substrate 210 are connected to input/output pads and input pads of respective input/output circuits (I/O circuits) on the I/O chip 211. The DRAM chips 201 stacked on the I/O chip 211 are connected to a data signal terminal, an address signal terminal, and a control signal terminal of the I/O chip 211 via the TSVs 215 corresponding to those terminals. Data signals, address signals, and control signals are transmitted and received between the chips via the corresponding TSVs 215. Potentials of a power source and GND are supplied to pads on the I/O chip 211 via the BGA terminals of the interposer substrate 210 and then supplied to power source terminals and GND terminals of the DRAM chips 201 via the corresponding TSVs 215.

The data signal terminal of each of the DRAM chips 201 is connected to the data signal terminal of the I/O chip 211 via the corresponding TSV 215. In this case, the TSV 215 as a data signal line is shared among the DRAM chips 201. Furthermore, the address signal terminals of the DRAM chips 201 use the corresponding TSV 215 as an address signal line in common. The address signal terminals of the DRAM chips 201 are connected to the address signal terminal of the I/O chip 211. Moreover, the control signal terminals of the DRAM chips 201 use the corresponding TSV 215 as a control signal line in common. The control signal terminals of the DRAM chips 201 are connected to the control signal terminal of the I/O chip 211.

FIG. 12 illustrates the semiconductor device 3000 in a different point of view (from a functional aspect). In FIG. 12, eight DRAM chips 201 are stacked on the I/O chip 211. One of the stacked DRAM chips 201 is selected as shown by hatched area. Thus, the memory module in which the present invention is applicable can change the number of DRAM chips 201 stacked on the I/O chip 211. Therefore, the I/O chip 211 is configured to be capable of judging the number of stacked DRAM chips 201.

In the example shown in FIG. 12, each of the DRAM chips 201 forms a single bank. Each of the DRAM chips 201 has ×256 data terminals, and the I/O chip 211 has ×64 system data lines.

Figure 13:
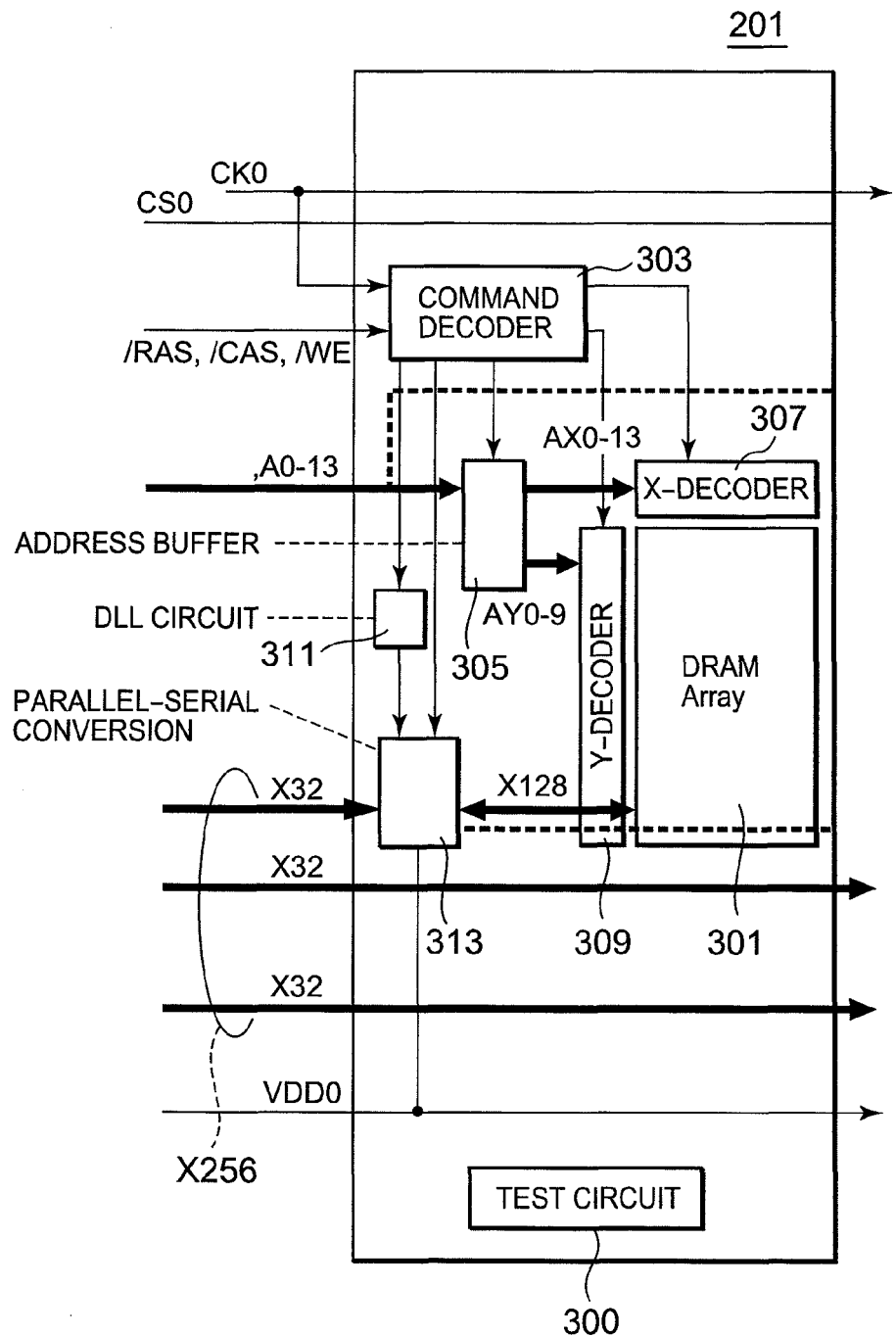
FIG. 13 is a diagram showing an overview of a memory chip in a semiconductor device to which the present invention is applicable.

FIG. 13 shows an example of a semiconductor device (DRAM chip 201) to which the technical concept of the present application has been applied. An overview of configuration of a DRAM chip will be described with reference to FIG. 13. This example shows a DRAM chip of Layer 0. DRAM chips of other layers also have the same configuration.

The DRAM chip 201 includes a test circuit 300, which is one of features of the present application. The details of the test circuit 300 will be described later with reference to FIG. 1. First, the overall configuration of the DRAM chip 201 will be described. Address signals A0-A13 are provided from a controller (not shown) to an address buffer 305. The address buffer 305 outputs address signals AX0-AX13 and AY0-AY9 to an X-decoder 307 and a Y-decoder 309, respectively. When the address signals AX0-AX13 and AY0-AY9 are supplied to the X-decoder 307 and the Y-decoder 309, a DRAM array 301 shown in FIG. 13 carries out parallel input/output of 128-bit data signals (i.e., ×128 data signals) with a parallel-serial conversion circuit 313. An input/output operation of the 128-bit data signals is performed by a command from a command decoder 303 that has received a chip selection signal CS0 and a clock signal CK0 and under the control of a clock from a DLL circuit. The command decoder 303 also receives a row address strobe signal /RAS, a column address strobe signal /CAS, a write enable signal /WE, and the like from the controller.

The parallel-serial conversion circuit 313 transmits ×128-bit parallel data signals to and receives ×128-bit parallel data signals from the DRAM array 301. The parallel-serial conversion circuit 313 also transmits 32-bit parallel data signals (×32) to and receives 32-bit parallel data signals (×32) from the controller. In other words, the parallel-serial conversion circuit 313 has a function of converting ×128-bit data signals into ×32-bit data signals and converting ×32-bit data signals into ×128-bit data signals.

Figure 1:
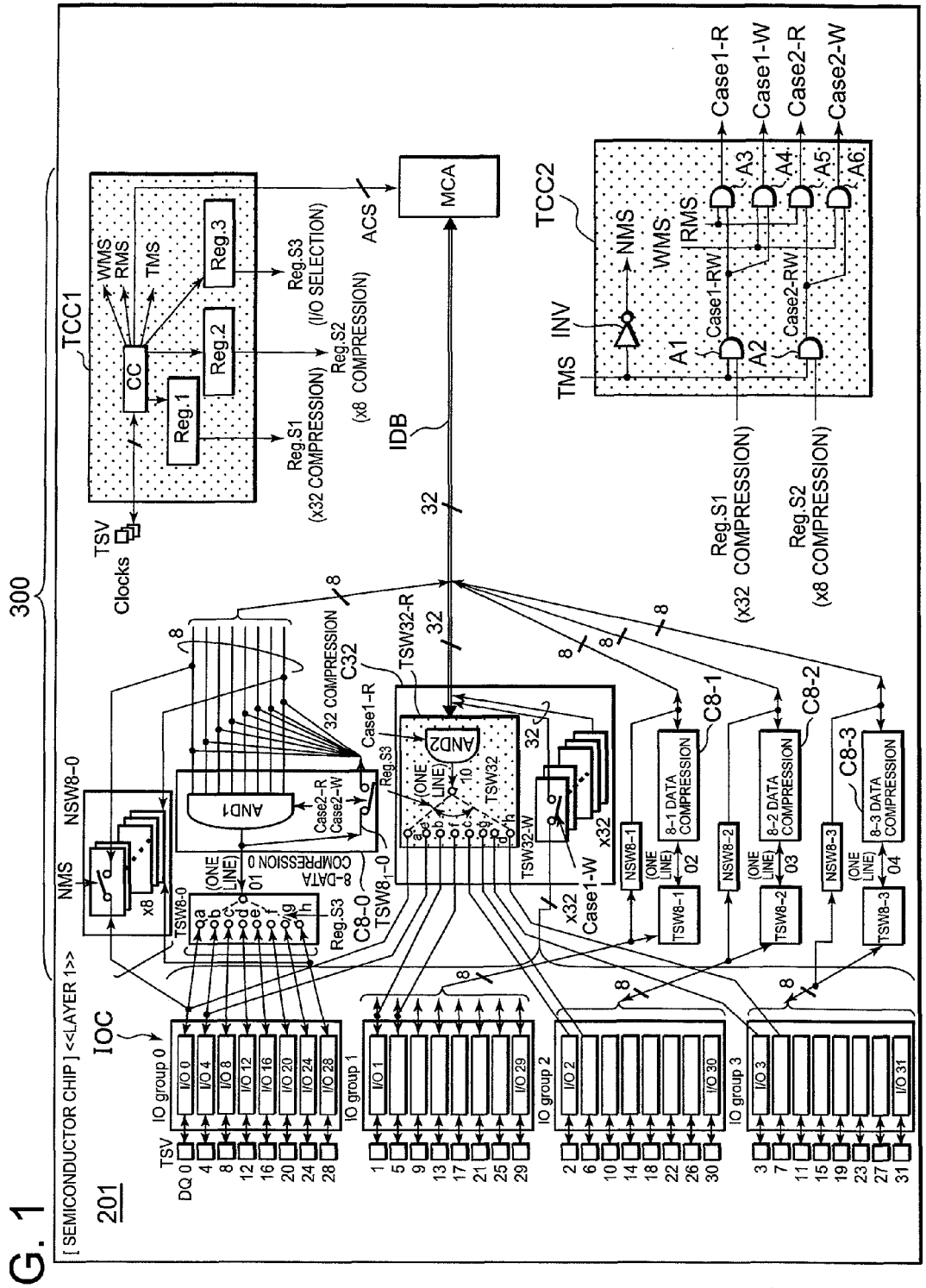
FIG. 1 is a diagram schematically showing components required for an I/O compression test in one of memory chips of a semiconductor device according to an embodiment of the present invention.

FIG. 1 schematically shows one memory chip (one layer) of eight semiconductor chips (memory chips) (Layers 0-7) included in the semiconductor device 3000. As a matter of course, other memory chips also have the same configuration as shown in FIG. 1. FIG. 1 primarily illustrates components required for an I/O compression test, which will be described later. Some components of the memory chip, such as the command decoder, the address buffer, the X-decoder, the Y-decoder, the DLL circuit, the parallel-serial conversion circuit, and various signals transmitted in these components described in connection with FIG. 13, are omitted from the illustration. Therefore, FIG. 1 shows only 32 TSVs required for transmitting various signals. Those TSVs are used as I/O terminals DQ0-DQ31.

In the upper right part of FIG. 1, a first test control circuit TCC1 is illustrated as a circuit component for a control system. The first test control circuit TCC1 comprises a control circuit CC. The control circuit CC is operable to generate a writing mode signal WMS, a reading mode signal RMS, and a test mode signal TMS based upon clock signals received via a plurality of TSVs, which are for receiving clock signals from a controller (not shown). The control circuit CC is also operable to generate a first control signal Reg.S1 (first or second information) for a 32-data I/O compression test via a first register Reg.1 (compression ratio setting register), generate a second control signal Reg.S2 (second or first information) for an 8-data I/O compression test via a second register Reg.2 (compression ratio setting register), and generate a third control signal Reg.S3 for selecting an I/O terminal via a third register Reg.3 (number setting register). The control circuit CC is also operable to output array control signals ACS to a memory cell array MCA. Instead of one of the first register Reg.1 and the second register Reg.2, an inverse signal obtained by inversing an output signal of the other register may be used.

In the lower right part of FIG. 1, a second test control circuit TCC2 is illustrated as another circuit component for a control system. The second test control circuit TCC2 is operable to generate Case1-W (first test condition signal), Case1-R (second test condition signal), Case2-W (third test condition signal), and Case2-R (fourth test condition signal), which define the type of data input and output (uncompressed or compressed) and the test mode (32-data I/O compression or 8-data I/O compression), based upon the test mode signal TMS, the writing mode signal WMS, the reading mode signal RMS, the first control signal Reg.S1, and the second control signal Reg.S2.

The second test control circuit TCC2 includes an inverter circuit INV operable to generate a normal mode signal NMS in response to the test mode signal TMS, a 2-input AND circuit A1 having inputs of the test mode signal TMS and the first control signal Reg.S1, a 2-input AND circuit A2 having inputs of the test mode signal TMS and the second control signal Reg.S2, a 2-input AND circuit A3 having inputs of the reading mode signal RMS and an output of the AND circuit A1 (Case1-RW), a 2-input AND circuit A4 having inputs of the writing mode signal WMS and the output of the AND circuit A1 (Case1-RW), a 2-input AND circuit A5 having inputs of the reading mode signal RMS and an output of the AND circuit A2 (Case2-RW), and a 2-input AND circuit A6 having inputs of the writing mode signal WMS and the output of the AND circuit A2 (Case2-RW). The AND circuits A3-A6 output Case1-R (second test condition signal), Case1-W (first test condition signal), Case2-R (fourth test condition signal), and Case2-W (third test condition signal), respectively.

The first to third registers Reg.1-Reg.3 may collectively be referred to as a register group. The first test control circuit TCC1 (the register group and the control circuit CC) and the second test control circuit TCC2 may collectively be referred to as a test control circuit.

A plurality of I/O terminals DQ0-DQ31 (a plurality of first nodes), which are formed by a plurality of TSVs, for external communication of the memory chip 201 are connected to known I/O circuit units IOC. It should be noted that those terminals correspond to the external terminals of the memory chip 201 in FIG. 10 and are different from the external terminals of the semiconductor device 1000 or 3000.

Referring back to FIG. 1, the I/O circuit unit IOC is connected to various components of the test circuit 300, which will be described later. The I/O circuit unit IOC is grouped into four I/O circuits (IO group 0 to IO group 3). Those groups constitute 8 compressed data×4 groups (hence 32-data I/O per one chip) during an I/O compression test, which will be described later. One group is formed by eight I/O terminals because eight memory chips (Layer 0 to Layer 7) are respectively switched to different I/O circuits (I/O terminals). The IO group 0 includes a plurality of I/O circuits I/O0, I/O4, I/O8, I/O12, I/O16, I/O20, I/O24, and I/O28 connected to the I/O terminals DQ0, DQ4, DQ8, DQ12, DQ16, DQ20, DQ24, and DQ28, respectively. The IO group 1 includes a plurality of I/O circuits I/O1, I/O5, I/O9, I/O13, I/O17, I/O21, I/O25, and I/O29 connected to the I/O terminals DQ1, DQ5, DQ9, DQ13, DQ17, DQ21, DQ25, and DQ29, respectively. The IO group 2 includes a plurality of I/O circuits I/O2, I/O6, I/O10, I/O14, I/O18, I/O22, I/O26, and I/O30 connected to the I/O terminals DQ2, DQ6, DQ10, DQ14, DQ18, DQ22, DQ26, and DQ30. The IO group 3 includes a plurality of I/O circuits I/O3, I/O7, I/O11, I/O15, I/O19, I/O23, I/O27, and I/O31 connected to the I/O terminals DQ3, DQ7, DQ11, DQ15, DQ19, DQ23, DQ27, and DQ31, respectively.

The packaged test circuit includes one 32-data compression circuit (32-data I/O compression circuit) C32 (second I/O compression circuit) with regard to a 32-data I/O compression test (first compression ratio) and four 8-data I/O compression circuits (four first I/O compression circuits) with regard to an 8-data I/O compression test (second compression ratio). The 32-data compression circuit (32-data I/O compression circuit) and the four 8-data I/O compression circuits may collectively be referred to as an I/O compression circuit. As features of the present invention, the 32-data compression circuit C32 includes a switch circuit TSW32-W operable to connect uncompressed write data to one or more specific I/O circuits (all of the I/O terminals DQ0-DQ31 in this example) during a 32-data I/O compression test and a switch circuit TSW32-R operable to connect compression results to one or more specific I/O circuits (one I/O terminal in this example). The term "32-data compression" means receiving 32 data and outputting one computation result signal of the computation result. The term "8-data compression," which will be described later, means receiving eight data and outputting one computation result signal of the computation result.

Meanwhile, compressed writing data or a compression result is connected to one or more specific I/O circuits (four I/O terminals in this example) during an 8-data I/O compression test. For this purpose, each group of the 8-data I/O compression circuits includes a combination of an 8-data compression circuit C8-$i$ and a switch circuit TSW8-$i$ corresponding to the 8-data compression circuit where i is 0 to 3. Specifically, the 8-data I/O compression circuits include a combination of an 8-data compression circuit C8-0 and a switch circuit TSW8-0, a combination of an 8-data compression circuit C8-1 and a switch circuit TSW8-1, a combination of an 8-data compression circuit C8-2 and a switch circuit TSW8-2, and a combination of an 8-data compression circuit C8-3 and a switch circuit TSW8-3.

The memory chip further includes four normal switch circuits NSW8-0, NSW8-1, NSW8-2, and NSW8-3 for an operation in a normal mode. Those normal switch circuits are connected in parallel to four sets of the series circuits including the 8-data compression circuits and the switch circuits.

The first to third registers Reg.1-Reg.3 used in the present embodiment have the following functions.

The register A (Reg.1) for determining the type of a test mode: Operation of data input without compression or operation of data output with compression can be selected individually.

The register B (Reg.2) for determining a data compression ratio: Operation of 32-data I/O compression or operation of 8-data I/O compression can be selected individually.

The register C (Reg.3) for determining I/O terminal(s): Setting one I/O terminal or setting a plurality of I/O terminals can be selected individually.

As described in detail later, an I/O compression test is performed in the following Cases 1 and 2.

Case 1:
A) Data input (writing) is carried out without compression. Data output (reading) is carried out with compression.
B) The compression ratio is set to be 32-data I/O compression.
C) One I/O terminal is set on each of the memory chip such that different I/O terminals are used in different memory chips.

Case 2:
A) Both of data input (writing) and data output (reading) are carried out with compression.
B) The compression ratio is set to be 8-data I/O compression.
C) A plurality of different I/O terminals are set on for each of the memory chips such that different I/O terminals are used in different memory chips.

In the following description, a writing operation in Case 1 and a reading operation in Case 1 are referred to as Case1-W and Case1-R, respectively. A writing operation in Case 2 and a reading operation in Case 2 may be referred to as Case2-W and Case2-R, respectively.

Now the 32-data compression circuit C32 will be described.

The switch circuit TSW32-R in the 32-data compression circuit C32 is used in a reading operation (Case1-R) of a 32-data I/O compression test. The switch circuit TSW32-R includes an AND circuit AND2 (logical circuit; second logical circuit) and a switch circuit TSW32 (first switch circuit or third switch circuit) connected to an output (output node: test result) of the switch circuit TSW32-R. The AND circuit AND2 is activated by a second test condition signal Case1-R, and 32 reading data (internal data buses IDB) from the memory cell array MCA by a reading operation of a 32-data I/O compression test are outputted to input nodes of the AND circuit AND2. The AND circuit AND2 brings an output (node 10: one compression result) of the AND circuit AND2 into a high level if all of the 32 reading data have the same logic. The switch circuit TSW32 is a circuit with one input and eight outputs (outputs a, b, c, d, e, f, g, and h). The switch circuit TSW32 is operable to switch into one of the outputs a to h by a third control signal Reg.S3 from the control circuit CC and to transfer the output of the AND circuit AND2 to the corresponding I/O circuit (I/O terminal).

Meanwhile, the switch circuit TSW32-W (second switch circuit or fourth switch circuit) in the 32-data compression circuit C32 is in the form of a circuit with one input and one output and is used in a writing operation (Case1-W) of a 32-data I/O compression test. The switch circuit TSW32-W is operable to transfer 32 writing data from the I/O circuits (I/O terminals) to 32 internal data buses IDB in parallel.

The four sets of the 8-data compression circuit C8-$i$, the switch circuit TSW8-$i$, and the normal switch circuit NSW8-$i$ have the same configuration. Therefore, the first set, i.e., the 8-data compression circuit C8-0, the switch circuit TSW8-0, and the normal switch circuit NSW8-0, will be described below.

The 8-data compression circuit C8-0 includes an AND circuit AND1 (logical circuit: first logical circuit) with eight inputs and one output and a switch circuit TSW8$_1$-0 (first switch circuit) with one input and eight outputs, which is connected to the output (output node: test result) of the AND circuit AND1. The AND circuit AND1 is used in a reading operation (Case2-R) of an 8-data I/O compression test. The AND circuit AND1 is activated by a fourth test condition signal Case2-R. Eight reading data (internal data buses) from the memory cell array MCA are outputted to the input nodes of the AND circuit AND1. The AND circuit AND1 brings the output (node 01; one compression result) of the AND circuit AND1 into a high level if all of the eight reading data have the same logic.

Meanwhile, the switch circuit TSW8$_1$-0 (second switch circuit) in the 8-data compression circuit C8-0 is used in a writing operation (Case2-W) of an 8-data I/O compression test. The switch circuit TSW8$_1$-0 is operable to connect its output to eight internal data buses and to transfer the signal of the node 01 to the eight internal data buses.

Next, the switch circuit TSW8-0 (first switch circuit) is used in both of a reading operation and a writing operation of an 8-data I/O compression test. The switch circuit TSW8-0 serves as a circuit with one input (node 01 side) and eight outputs (outputs a to h sides) in a reading operation and serves as a circuit with eight inputs (inputs a to h sides) and one output (node 01 side) in a writing operation. Specifically, in a reading operation, the switch circuit TSW8-0 is operable to switch into one of the outputs a to h in accordance with a third control signal Reg.S3 and to output the output of the AND circuit AND1 to the corresponding I/O circuit (I/O terminal). In a writing operation, the switch circuit TSW8-0 is operable to switch into one of the inputs a to h in accordance with a third control signal Reg.S3 and to transfer an input from the corresponding I/O circuit (I/O terminal) to the switch circuit TSW$8_1$-0 controlled by a third test condition signal (Case2-W).

Thus, the switch circuit TSW8-0 is used in both of a reading operation and a writing operation of an 8-data I/O compression test. A combination of the switch circuit TSW8-0 and the switch circuit TSW$8_1$-0 may be referred to as a primary switch circuit, and a combination of the switch circuit TSW8-0 and the AND circuit AND1 may be referred to as a secondary switch circuit.

As described above, there are four normal switch circuits NSW8-0 to NSW8-3 as circuit elements used for purposes other than a test (circuit elements used in a normal operation) between the I/O circuits and the internal data buses. Each of the normal switch circuits is in the form of a circuit with one input and one output. For example, the normal switch circuit NSW8-0 is operable to connect the I/O circuits to the internal data buses in a normal operation and to transfer the corresponding data (writing data or reading data) therebetween.

Next, circuit elements of a control system will be described in detail.

As described above, the memory chip includes a plurality of TSVs, to which a plurality of clock signals are inputted for controlling the memory chip, a control circuit CC, which receives those signals, first to third registers Reg.1-Reg.3, and a second test control circuit TCC2 operable to generate a plurality of types of test condition signals including Case1-R, Case1-W, Case2-R, and Case2-W.

A plurality of TSVs, to which a plurality of control signals are inputted for control, is also connected in common between eight layers of the memory chips in the same manner as the TSVs relating to an I/O compression test.

The control circuit CC is operable to generate the following control signals from signals such as clock signals received via the TSVs.

A writing mode signal WMS is a fundamental signal for commanding a writing operation to a memory chip.

A reading mode signal RMS is a fundamental signal for commanding a reading operation to a memory chip.

A test mode signal TMS is a fundamental signal for commanding a test mode operation to a memory chip.

The control circuit CC is operable to register the degree of I/O compression for a test (32-data I/O compression or 8-data I/O compression in this example) as setting information in the first register Reg.1 and the second register Reg.2. For a 32-data I/O compression test, a high level is registered in the first register Reg.1 from the exterior of the memory chip (controller) via the TSV for control. For an 8-data I/O compression test, a high level is registered in the second register Reg.2 from the exterior of the memory chip via the TSV for control. If both of the first and second registers Reg.1 and Reg.2 have a high level, an arbiter (not shown) selects either one of compression modes.

The control circuit CC is also operable to perform a registration to the third register Reg.3. The third register Reg.3 has a function of storing information of the layer number of the memory chips. A code is registered in the third register Reg.3 from the exterior of the memory chip via the TSV for control. This code may be set during a test or may be set before the memory chip is diced in a wafer state. Alternatively, the code may be set after a plurality of memory chips are assembled into one semiconductor device. Meanwhile, the third register Reg.3 may be implemented by a volatile layer recognition circuit provided on each memory chip, which automatically recognizes the layer number when (or after) power is supplied to the semiconductor device 1000. In a case of eight layers of stacked memory chips with binary registration, the code is a 3-bit code in binary notation, which will be described later. For example, the layer number information for Layer 0 is expressed by "000," and the layer number information for Layer 1 is expressed by "001." The layer number information for other layers is expressed in the same manner. Thus, the layer number information for Layer 7 is expressed by "111." The third register Reg.3 may be nonvolatile (e.g., ROM).

The third register Reg.3 controls various switch circuits (TSW32, TSW8-0 to TSW8-3, and the like), and, in a reading mode during a test, provides the switch circuits with information for switching to use different I/O circuits (I/O terminals) in different memory chips such that no bus fight occurs on a plurality of test results of the memory chips in the I/O circuits (I/O terminals) connected by the common TSVs, that is, such that no bus fight occurs in the semiconductor device. The same operation is performed in a writing mode of an 8-data I/O compression test. Switching to use different I/O circuits (I/O terminals) is conducted on each of the memory chips so as not to fetch writing data having a different logic (data on different TSV lines).

Examples of the layers of the memory chips and switching will be described later.

The second test control circuit TCC2 is operable to generate a Case1 signal for commanding a 32-data I/O compression test and a Case2 signal for commanding an 8-data I/O compression test. As described above, the postfix "-R" following "Case1" or "Case2" means a signal for activation in a reading operation during a test. The postfix "-W" following "Case1" or "Case2" means a signal for activation in a writing operation during a test. Those signals are selected to be activated by the first register Reg.1 and the second register Reg.2. In addition, the second test control circuit TCC2 is operable to generate a normal mode signal NMS indicative of a state other than a test.

The memory cell array MCA carries out input/output of 32 data in response to one command (reading command or writing command).

Figure 2:
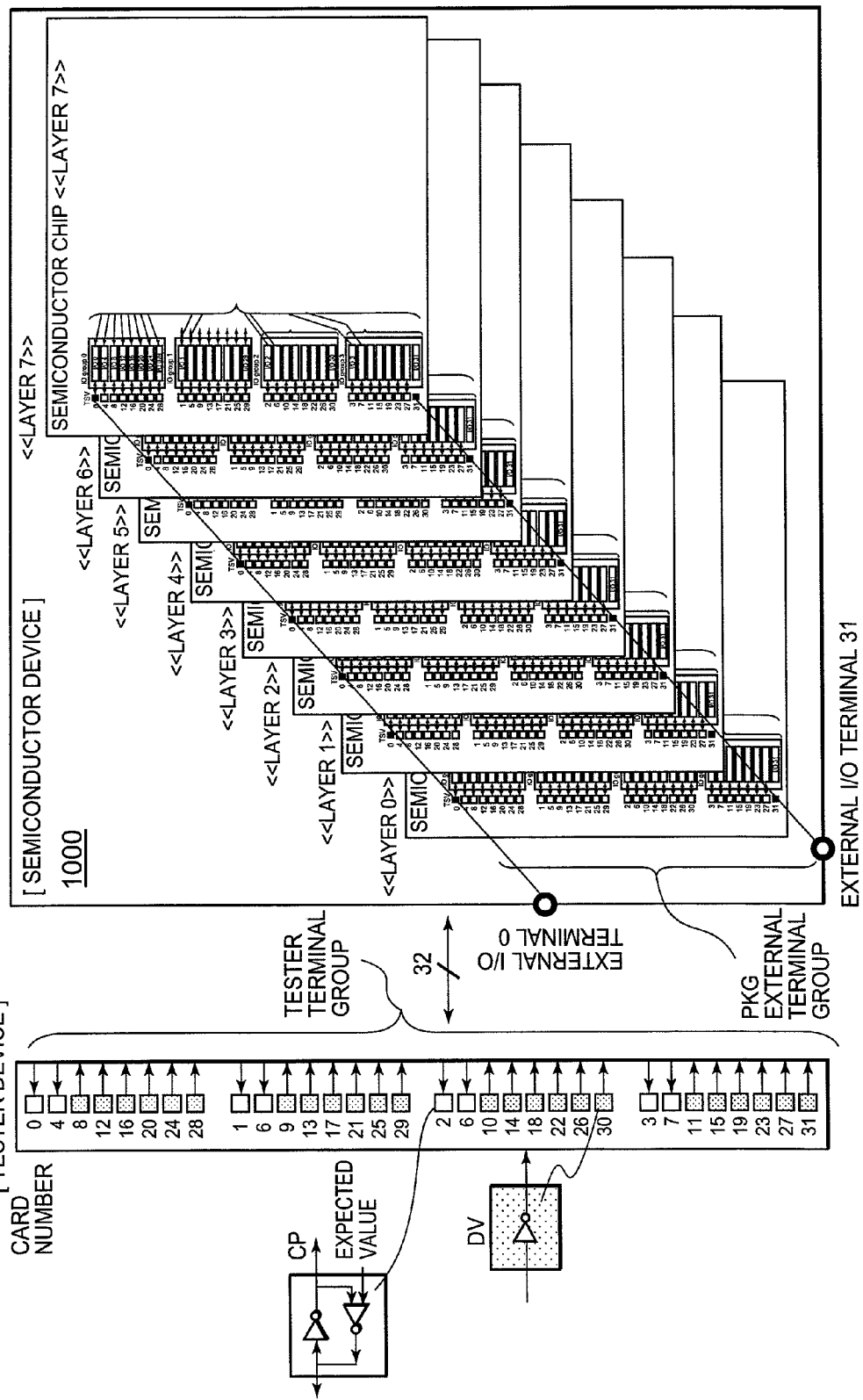
FIG. 2 is a diagram explanatory of a 32-data I/O compression test in a semiconductor device according to an embodiment of the present invention.

FIG. 2 is a schematic diagram showing a semiconductor device comprising a stacked structure of eight layers of memory chips with 32 I/O terminals (data terminals) DQ0-DQ31 being connected in common (parallel connection) by a plurality of TSVs, as well as a tester device comprising a plurality of drives DV (data drives) and a plurality of drive-comparator units CP (for comparing an output from the corresponding I/O terminal with an expected value). The I/O chip 211 is omitted from the illustration. The configuration of each of the memory chips (one layer) is as described above. Particularly, FIG. 2 is a diagram explanatory of a 32-data I/O compression test in Case 1.

Each of the eight memory chips is represented by one of the layer numbers 0-7. At the left side of FIG. 2, there is illustrated an example of the tester device and the drive DV and the drive-comparator unit CP in the tester device. At the right side of FIG. 2, there is illustrated that one I/O terminal DQ of each layer of the memory chips is connected in common by a plurality of TSVs (eight TSVs in this example) corresponding in the respective layers and is connected to I/O circuits of the respective memory chips. The TSVs (I/O terminals) are connected in common between the memory chips and connected to the drive DV or the drive-comparator unit CP of the tester device.

The layer numbers correspond to information in the third register Reg.3 as described above.

For example, a plurality of external terminals (PKG external terminal group, 32 I/O terminals, or external I/O terminals) of the semiconductor device are formed by a well-known solder ball or the like. During a test, pins of the drives DV or pins of the drive-comparator units CP of the tester device are brought into contact with the external terminals (solder balls) of the semiconductor device via a test tool such as a socket. In this example, 32 TSVs corresponding to 32 I/O terminals DQ0-DQ31 are respectively connected to 32 external terminals (solder balls). The 32 I/O circuits corresponding to the 32 TSVs are grouped into four groups. In the present embodiment, the tester device has 32 output pins, which are grouped into four groups. The card numbers (pin numbers) in the tester device are numbered so as to correspond to the numbers of the 32 I/O terminals in each group. In the present example (Case 1), the first and second elements in each group of the tester device, eight elements in total, serve as a drive-comparator unit CP. The remaining 24 elements serve as a drive DV.

Referring to FIG. 2, Case 1 will be described. Conditions of Case 1 are as follows: A) Data input is carried out without compression. Data output is carried out with compression. B) The compression ratio is set to be 32-data I/O compression. C) One I/O terminal is set on each of the memory chip such that different I/O terminals are used in different memory chips.

Figure 4:
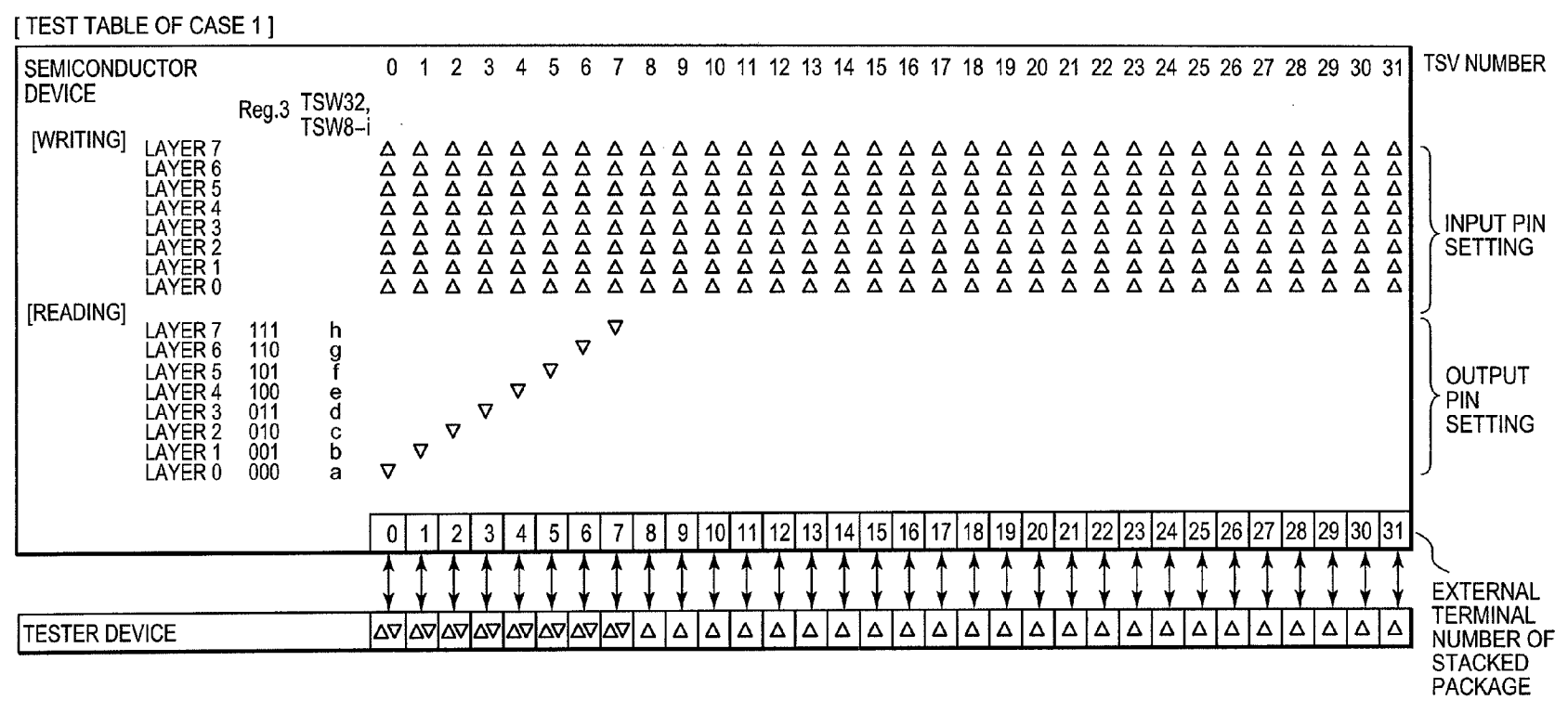

After power is supplied to the semiconductor device, different information is set in the third registers Reg. 3 of the first and second chips, respectively. The different information is recognized by a layer recognition circuit of each of the first and second chips or is set from the exterior of the semiconductor device. In a writing operation during a test, as shown in "[Writing]" of a test table of FIG. 4 with regard to Case 1, the tester device outputs writing data from the eight drive-comparator units CP and the 24 drives DV to the PKG external terminals of the semiconductor device. Each of the eight memory chips in the semiconductor device has 32 I/O terminals DQ0-DQ31, which are connected in common by common TSVs. Those TSVs have cascade connection in the stacking direction. Therefore, 32 writing data (parallel data) from the tester device are concurrently written into the respective memory cell arrays in the eight memory chips. Specifically, in each of the memory chip, data are written from each of the 32 I/O terminals DQ0-DQ31 (32 TSVs) to the corresponding internal data bus (of 32 lines connected to the memory cell array MCA) via the switch circuit TSW32-W (see FIG. 1). In FIG. 4, the symbol "∇" (inverted triangle) means outputting reading data to the tester device, whereas the symbol "Δ" (triangle) means inputting writing data from the tester device.

In a reading operation during a test, as shown in "[Reading]" of the test table of FIG. 4 with regard to Case 1, the semiconductor device outputs information of one (generated) test result of each memory chip (eight test results in total in the semiconductor device) via one TSV, i.e., one I/O terminal, to the corresponding terminals of the eight PKG external terminals in the semiconductor device such that different TSVs are used in the eight memory chips. The tester device receives the eight test results with the eight drive-comparator units CP of the card number 0-7, which are respectively connected to the eight PKG external terminals. Then, the tester device compares the test results with the corresponding eight expectations for the purpose of verification. The tester device determines that the test results are normal if all of the eight test results have the same logic as the expectations.

Thus, in the tester device, the number of the comparators CP, which is more expensive than the drives DV, can be reduced to eight. In other words, the drives DV and the comparators CP of the tester device only require eight channels, which correspond to DQ0-DQ7 to be subjected to I/O compression. On the other hand, only 24 channels (=32−8) are required for the drives of the tester device that perform no I/O compression (or transmit only writing data).

That is, the number of comparators used in one semiconductor device, which includes eight memory chips in this example, can be reduced. The reduction of the resources can be allocated to other devices (semiconductor devices). Therefore, the number of semiconductor devices to be measured can be increased when a plurality of semiconductor devices are to be simultaneously measured (in parallel). In either case, cost required for a test can remarkably be reduced.

In the internal data buses (32 lines) of each of the memory chips, reading data are compressed with 32-data I/O compression (verified with the AND circuit AND2). The results are outputted to one of the I/O terminals (one PKG external terminal of the semiconductor device) via one terminal of the switch circuit TSW32. The aforementioned selection of one I/O terminal is made by the third register Reg.3 of each memory chip such that different I/O terminals are used in different memory chips. Specifically, as is apparent from FIG. 4, the switch circuit TSW32 of the memory chip of Layer 0 selects the output a, and the switch circuit TSW32 of the memory chip of Layer 1 selects the output b. Selections for other layers are made in the same manner. The switch circuits TSW32 of the memory chips of Layers 2, 3, 4, 5, 6, and 7 select the outputs c, d, e, f, g, and h, respectively.

During a normal operation, in which no test is performed, the eight memory chips are under exclusive control. It should be noted that the eight memory chips are concurrently accessed in the test of Case 1. The exclusive control is required to prevent a bus fight because a plurality of I/O terminals of the eight memory chips are connected in common. For example, during a normal operation, a memory chip is recognized by three lines of address signals (not shown) for selecting one of the eight memory chips, which are mapped into different address spaces on a system space (logic). The semiconductor device does not care (or inhibits) those three address lines in accordance with a test signal. Three lines of control signals (e.g., three lines of CS signals or three lines of WE signals) may be used instead of those three address lines.

Figure 3:
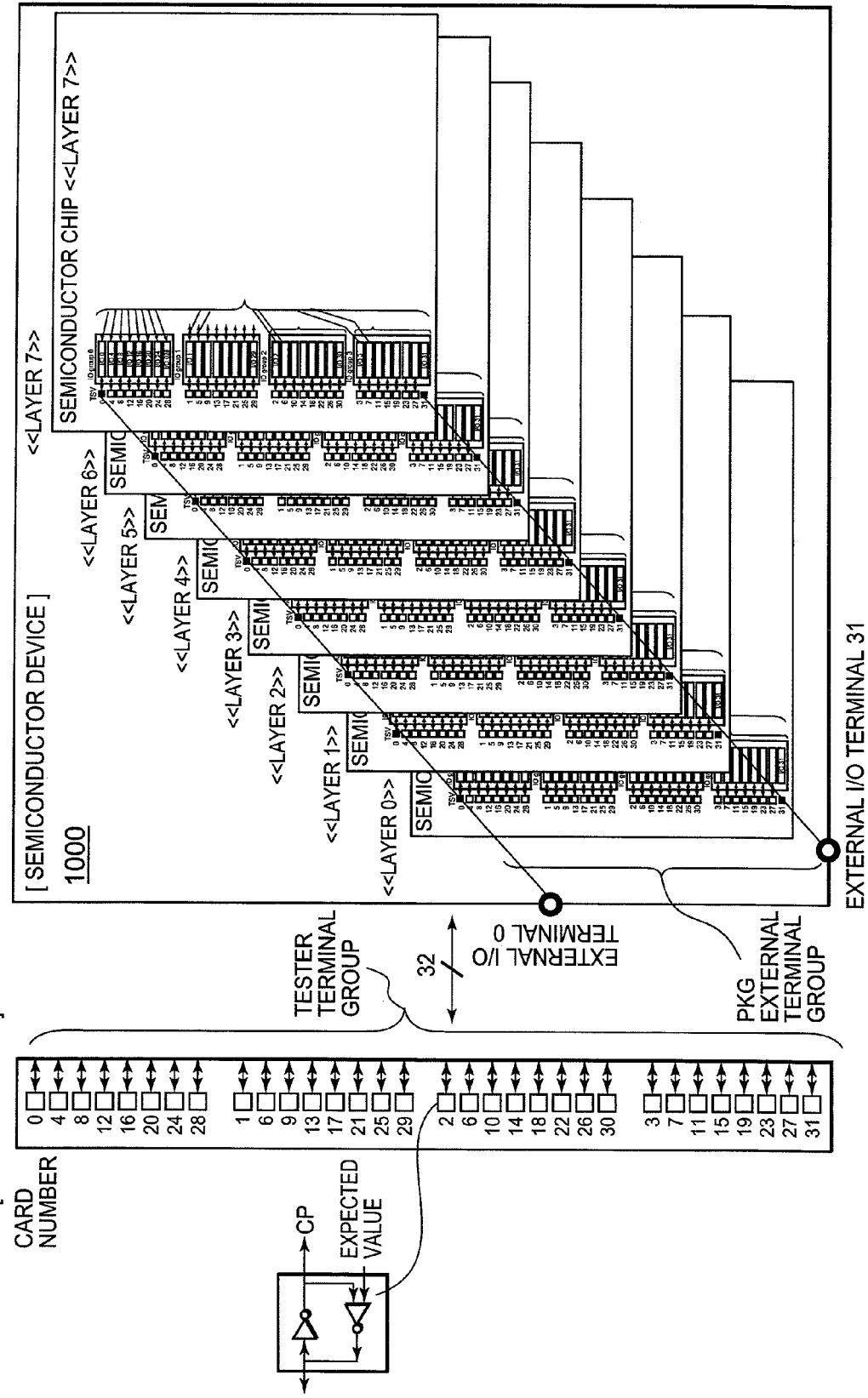
FIG. 3 is a diagram explanatory of an 8-data I/O compression test in a semiconductor device according to an embodiment of the present invention.

Referring to FIG. 3, Case 2 will be described. Conditions of Case 2 are as follows: A) Both of data input and data output are carried out with compression. B) The compression ratio is set to be 8-data I/O compression. C) A plurality of different I/O terminals are set on for each of the memory chips such that different I/O terminals are used in different memory chips. The following discussion is focused on primary differences between FIG. 2 and FIG. 3. The semiconductor device comprises the same structure as described in connection with FIG. 2. In this example (Case 2), all of the groups in the tester device serve as a drive-comparator unit CP.

In a writing operation during a test, as shown in "[Writing]" of a test table of FIG. 5 with regard to Case 2, the tester device outputs writing data from the 32 drive-comparator units CP to the PKG external terminals of the semiconductor device. The semiconductor device has common connections using eight TSVs in connection with one I/O terminal DQ. In other words, the semiconductor device includes eight layers of memory chips having 32 I/O terminals DQ. Four of 32 writing data from the tester device are assigned to each of the memory chips. Those four writing data are associated with different I/O terminals DQ in each of the memory chips, which will be described later. In one memory chip, each of the writing data is concurrently written into eight internal data buses (eight lines connected to the memory cell array MCA). Specifically, data are written into the corresponding internal data buses (eight lines) from one of the I/O terminals via the corresponding switch circuit TSW8-$i$ and 8-data compression circuit C8$_1$-$i$ (a switch controlled by a test condition signal Case2-W) for each group of each memory chip where i is 0, 1, 2, or 3. Thus, data are concurrently written into the memory cell arrays of the eight memory chips in four lines corresponding to four writing data (four switch circuits TSW8-$i$ and four 8-data compression circuits C8-$i$). In FIG. 5, the symbol "Δ" means a drive (card) for merely outputting data from the tester device, whereas the symbol "Δ∇" means a drive (card) and a comparator (card) for inputting data to and outputting data from tester device.

In a reading operation during a test, as shown in "[Reading]" of the test table of FIG. 5 with regard to Case 2, information of four (generated) test results of each memory chip (32 test results in total) is outputted to the 32 PKG external terminals of the semiconductor device via TSVs, i.e., via I/O terminals such that different TSVs are used in the eight memory chips. The tester device compares the 32 test results with the corresponding 32 expectations for the purpose of verification in the 32 drive-comparator units CR The tester device determines that the test results are normal if all of the 32 test results have the same logic as the expectations.

Thus, the tester device can combine data patterns such that different patterns are used in the different memory chips and/or in the 8-data compression groups. Therefore, a high-level test screening can be performed. Particularly, data interference between a plurality of TSVs can be included in a test. Intervals of TSV rows with cascade connection in the stacking direction are at least ten times as small as intervals of external signal lines of the semiconductor device. It is possible to check adverse influence caused by coupling interference between the TSV rows. Furthermore, gaps between the stacked memory chips are also small. With those characteristic structure, it is possible to examine influence due to different data between the layers by varying writing data depending upon DQ sets or layers, for example, by using "high" data for I/O terminals DQ0-DQ3 (in the case of Layer 0) and "low" data for I/O terminals DQ4-DQ7 (in the case of Layer 1). For example, only data for I/O terminals DQ16-DQ19 of Layer 4 are set to be different from data for I/O terminals of other layers. In this case, Layer 4 is interposed between the memory chips of Layer 3 and Layer 5. The coupling capacity of parallel plates of the memory chips of Layer 3 and Layer 5 can be used to examine whether or not the memory chip of Layer 4 that processes data is influenced from interference of the memory chips of Layers 3 and 5 that process those data.

Data of the internal data buses (eight lines) of each memory chip are compressed with the 8-data compression circuit C8-$i$ (and verified with the AND circuit AND1). The result is outputted to one of the I/O terminals (one PKG external terminal of the semiconductor device) via the switch circuit TSW8-$i$. The selection of one of the I/O terminals is made with the third register Reg.3 in a different manner depending upon the memory chips. Since one layer of the memory chips includes four lines of 8-data compression circuits C8-0 to C8-3, each layer outputs four compression results. Furthermore, selection of four I/O terminals to which the four 8-data compression circuits C8-0 to C8-3 output the results is systematically controlled by the third register Reg.3.

In Case 2, as described above, the eight memory chips are under exclusive control during a normal operation, in which no test is performed. It should be noted that the eight memory chips are concurrently accessed in the test.

Figure 6:
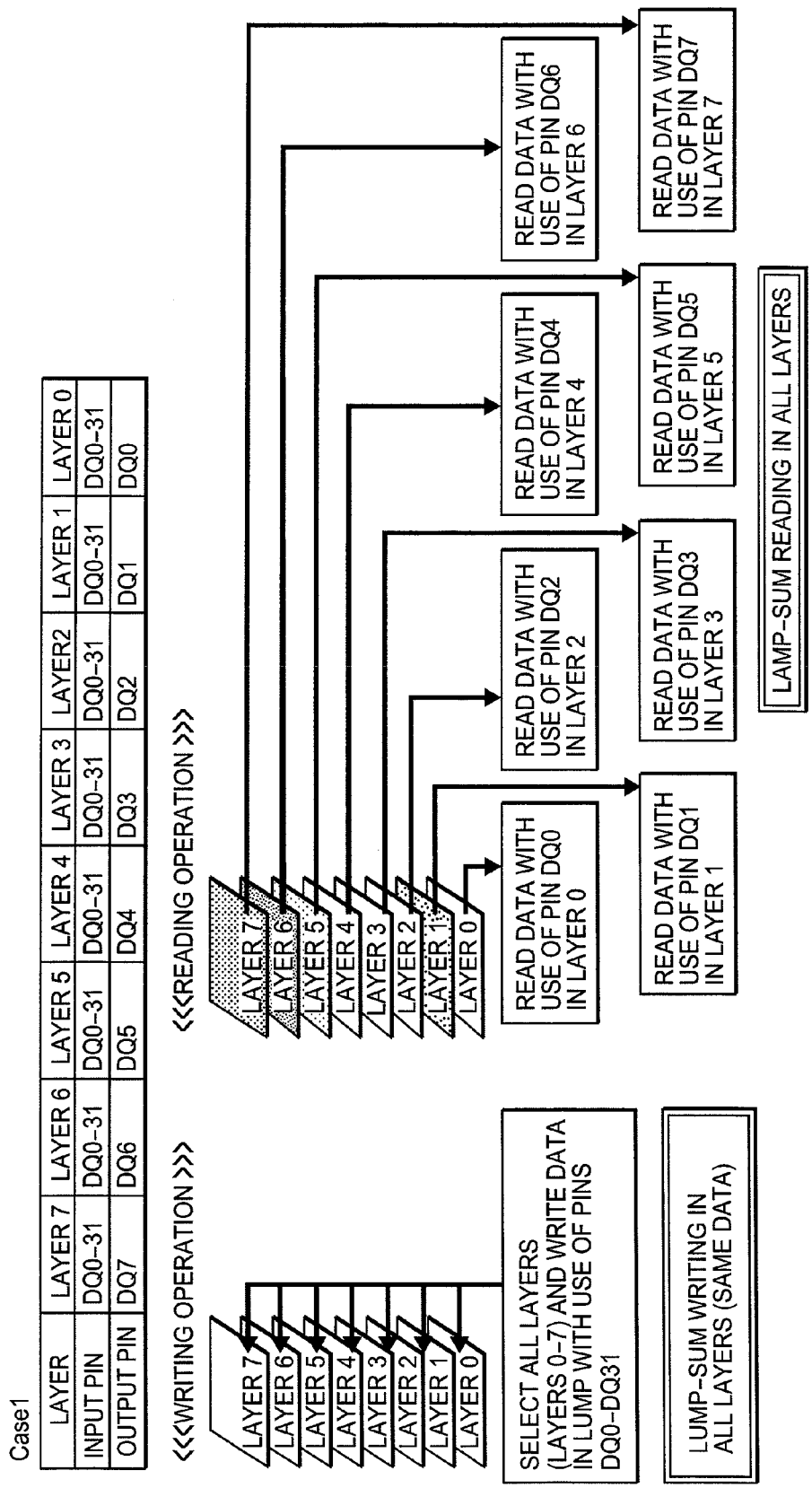
FIG. 6 is a diagram explanatory of the relationship of I/O terminals used in a writing operation and I/O terminals used in a reading operation of a 32-data I/O compression test of a semiconductor device according to an embodiment of the present invention.
Figure 7:
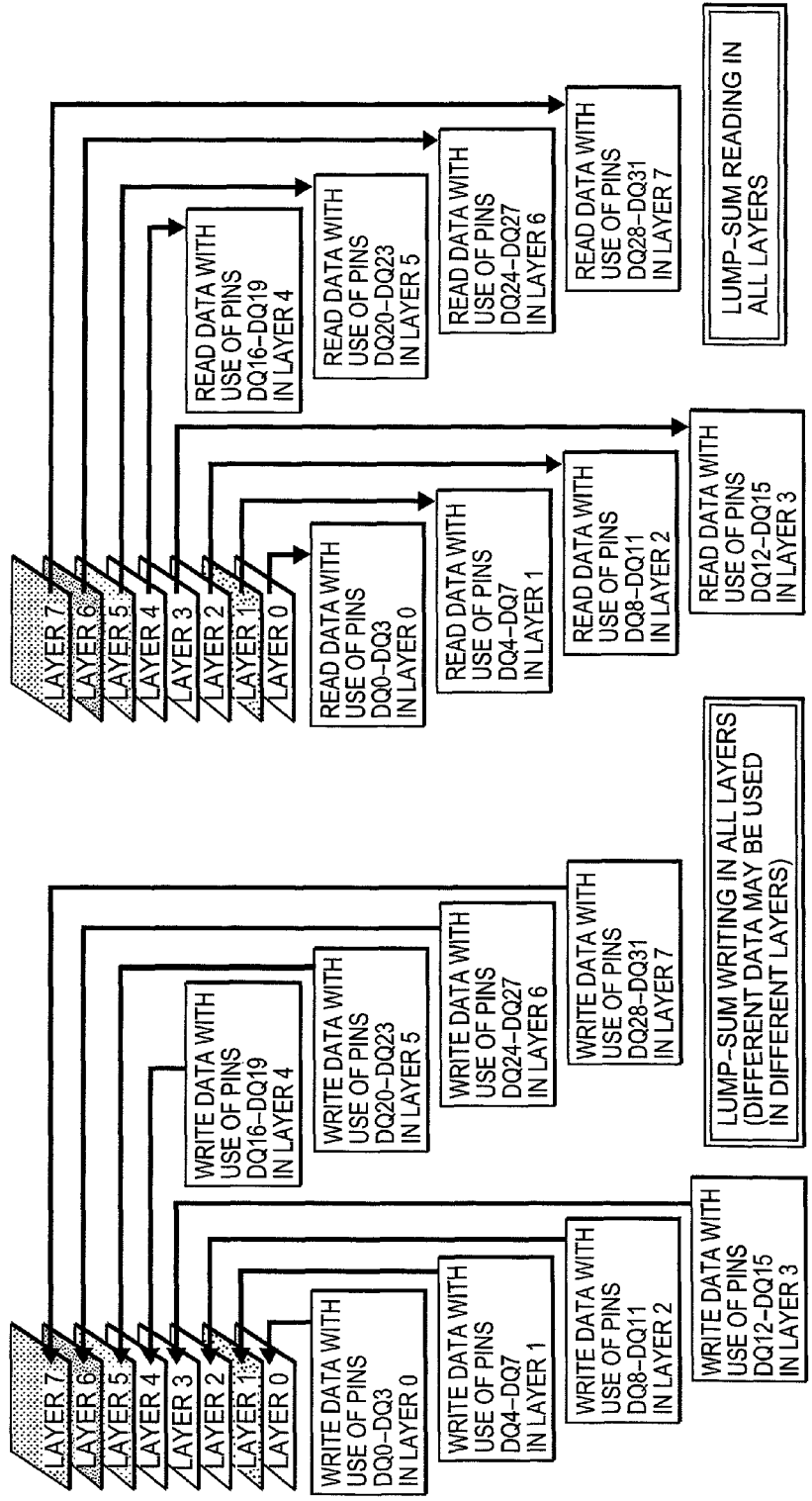
FIG. 7 is a diagram explanatory of the relationship of I/O terminals used in a writing operation and I/O terminals used in a reading operation of an 8-data I/O compression test of a semiconductor device according to an embodiment of the present invention.
Figure 8:
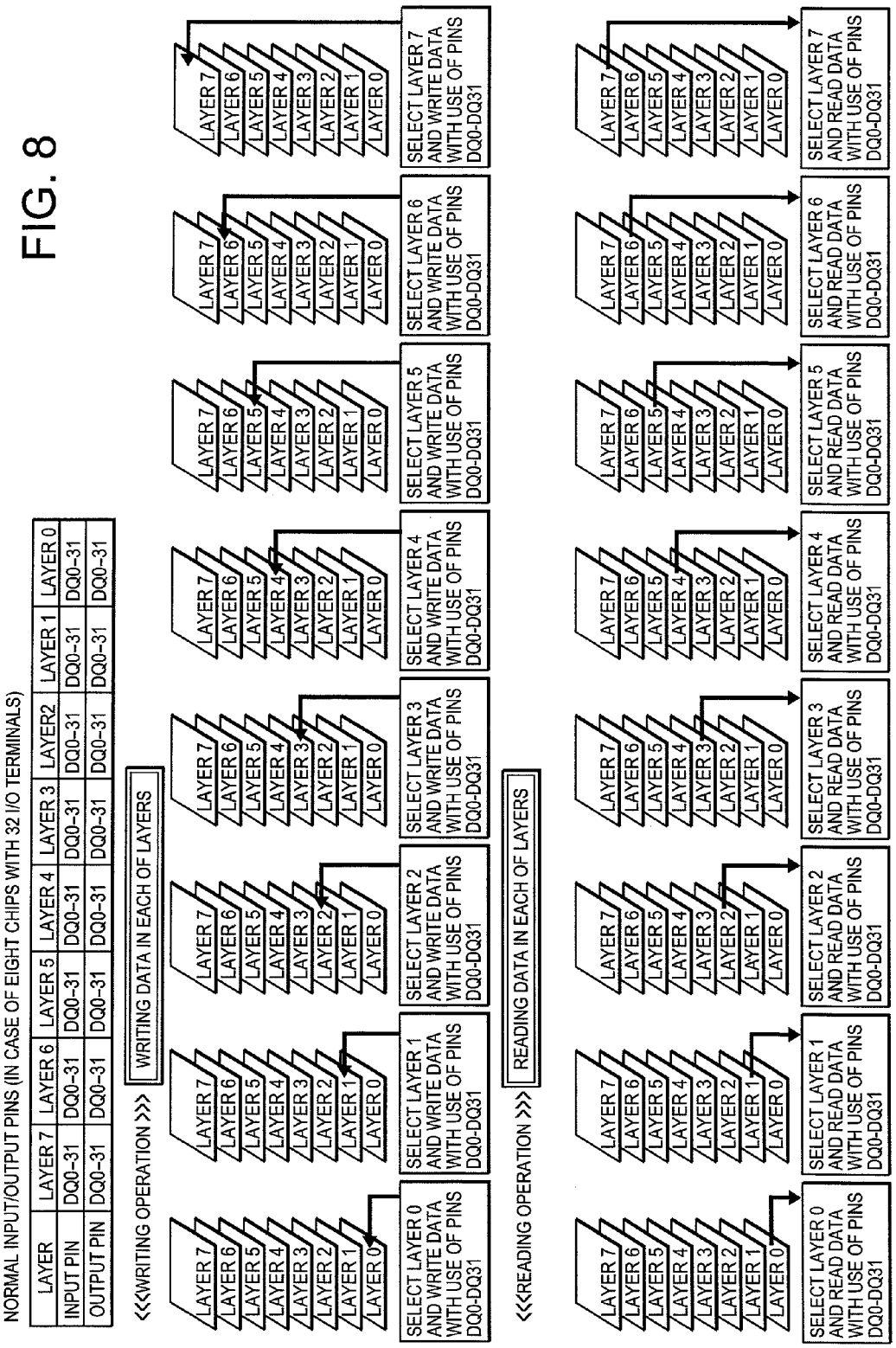
FIG. 8 is a diagram explanatory of the relationship of I/O terminals used in a writing operation and I/O terminals used in a reading operation of a 32-data I/O compression test of a semiconductor device according to an embodiment of the present invention.

FIGS. 6 to 8 are diagrams showing the relationship of input pins (I/O terminals used in a writing operation) and output pins (I/O terminals used in a reading operation) of the respective layers (in the case of eight layers) during the aforementioned 32-data I/O compression test, 8-data I/O compression test, and normal mode.

FIG. 6 is a diagram explanatory of Case 1. In FIG. 6, pins DQ that are common to all of the layers are set as data input pins. One individual pin is set as an output pin in each of the layers: a pin DQ0 for Layer 0, a pin DQ1 for Layer 1, . . . , and a pin DQ7 for Layer 7.

Referring to FIG. 6, the same data are written in a lump to all of the layers in a writing operation of a 32-data I/O compression test. All of the memory chips of Layers 0 to 7 are selected, and data are written in a lump to all of the layers with use of all of the 32 I/O terminals DQ0-DQ31. Meanwhile, data are read in a lump from all of the layers in a reading operation. However, the reading operation uses one I/O terminal in each of the layers. For example, the I/O terminal DQ0 is used in the memory chip of Layer 0, the I/O terminal DQ1 in the memory chip of Layer 1, the I/O terminal DQ2 in the memory chip of Layer 2, the I/O terminal DQ3 in the memory chip of Layer 3, the I/O terminal DQ4 in the memory chip of Layer 4, the I/O terminal DQ5 in the memory chip of Layer 5, the I/O terminal DQ6 in the memory chip of Layer 6, and the I/O terminal DQ7 in the memory chip of Layer 7.

FIG. 7 is a diagram explanatory of Case 2. In FIG. 7, several individual pins are set as data input pins in each of the layers: pins DQ0-DQ3 for Layer 0, pins DQ4-DQ7 for Layer 1, pins DQ8-DQ11 for Layer 3, . . . , and pins DQ29-DQ32 for Layer 7.

Referring to FIG. 7, data are written in a lump to all of the layers in a writing operation of an 8-data I/O compression test. Nevertheless, four I/O terminals are used in each of the layers. For example, the same data are written into the memory chip of Layer 0 by using the four I/O terminals DQ0-DQ3 (I/O terminal DQ0 of IO group 0, I/O terminal DQ1 of IO group 1, I/O terminal DQ2 of IO group 2, and I/O terminal DQ3 of IO group 3). The same data are written into the memory chip of Layer 1 by using the four I/O terminals DQ4-DQ7. Similarly, the same data are written by using the four I/O terminals DQ8-DQ11 for Layer 2, the four I/O terminals DQ12-DQ15 for Layer 3, the four I/O terminals DQ16-DQ19 for Layer 4, the four I/O terminals DQ20-DQ23 for Layer 5, the four I/O terminals DQ24-DQ27 for Layer 6, and the four I/O terminals DQ28-DQ31 for Layer 7. While the same writing data should be used in the same layer, different data may be written into different layers.

Meanwhile, data are read in a lump from all of the layers in a reading operation. The reading operation uses four I/O terminals in each of the layers. For example, the four I/O terminals DQ0-DQ3 are used to read data from the memory chip of Layer 0. The four I/O terminals DQ4-DQ7 are used to read data from the memory chip of Layer 1. Similarly, data are read by using the four I/O terminals DQ8-DQ11 for Layer 2, the four I/O terminals DQ12-DQ15 for Layer 3, the four I/O terminals DQ16-DQ19 for Layer 4, the four I/O terminals DQ20-DQ23 for Layer 5, the four I/O terminals DQ24-DQ27 for Layer 6, and the four I/O terminals DQ28-DQ31 for Layer 7.

Referring to FIG. 8, writing and reading in a normal mode are respectively conducted in the individual layers. Specifically, any of the layers (memory chips) is selected for writing, and a writing operation is performed with use of the 32 I/O terminals DQ0-DQ31. Any of the layers is selected for reading, and a reading operation is performed with use of the 32 I/O terminals DQ0-DQ31.

ADVANTAGEOUS EFFECTS OF THE EMBODIMENT

1) An I/O compression test can be performed in parallel concurrently on a plurality of memory chips. Therefore, a period of time required for an I/O compression test can be shortened.

2) When an I/O compression test is performed at the highest compression ratio (with use of only one terminal of 32 I/O terminals), only drives and comparators corresponding to such compression are required in a tester device. Therefore, the number of drives and comparators in a tester device can be reduced, and cost reduction can thus be achieved.

3) It is assumed that noise varies depending upon data of the respective memory chips (substrates) and that the memory chips are coupled to each other with a parasitic capacity. In a case of a plurality of stacked chips, interference between the layers can be examined by performing a test with different (compressed) data between different layers in Case 2. Furthermore, a test capable of screening that includes coupling noise of signals between a plurality of TSV rows having cascade connection in the stacking direction. Pitches of the TSV rows are at least ten times as small as pitches of external signal lines of the semiconductor device.

Figure 9:
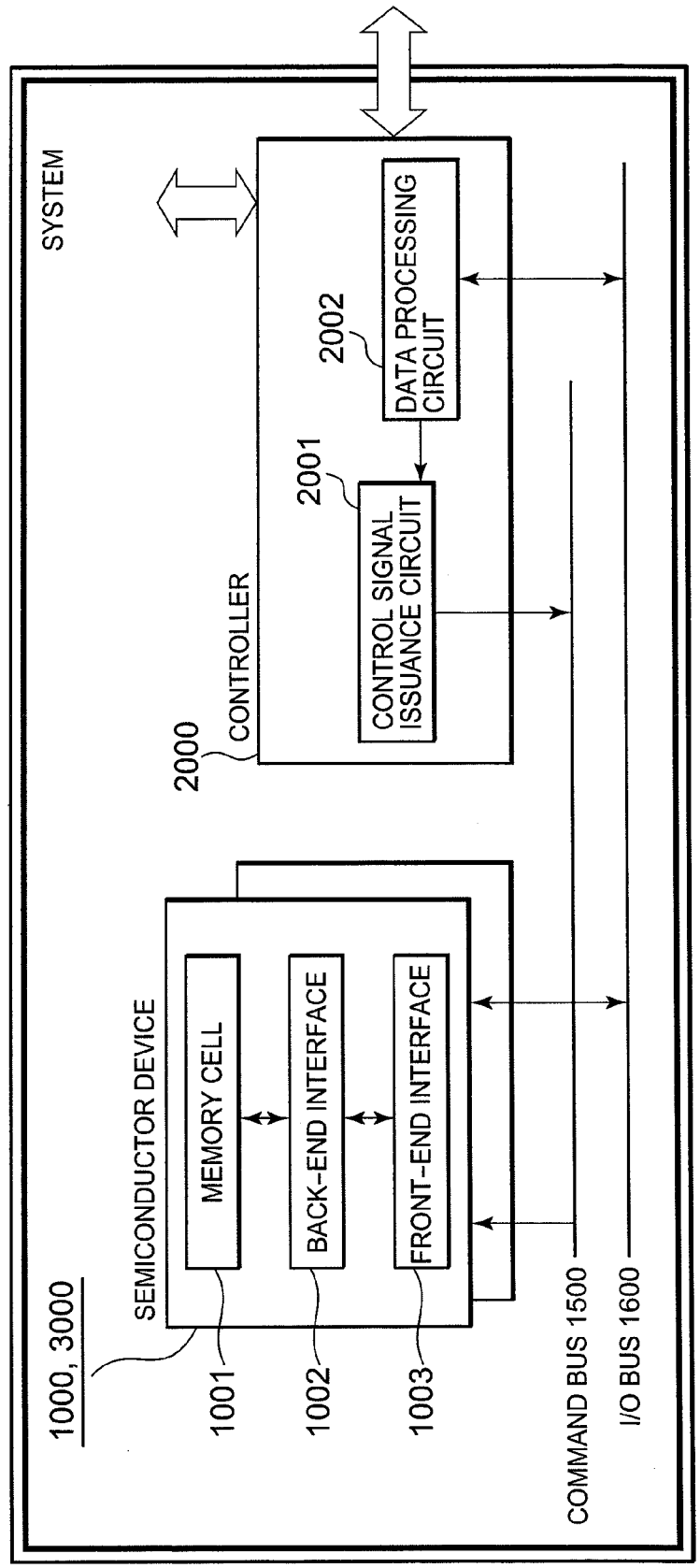
FIG. 9 is a block diagram showing an overview of a system according to an embodiment of the present invention.

A memory system according to an embodiment of the present invention will be described with reference to FIG. 9.

A memory system will be described with use of the semiconductor device described in connection with FIGS. 1 and 2. This memory system includes a semiconductor device 1000 (or 3000) comprising eight stacked memory chips (Layer 0 to Layer 7) and a controller 2000 connected to the respective memory chips of the semiconductor device 1000 via a command bus 1500 and an I/O bus 1600.

A front-end interface 1003 of each memory chip includes four groups of I/O circuits (IO group 0 to IO group 3) of a memory chip (one layer) in a block diagram of FIG. 1. The front-end interface 1003 also includes circuit elements relating to a test, such as the switch circuits TSW8-0 to TSW8-3 corresponding to the four groups, the 8-data compression circuits C8-0 to C8-3 corresponding to the four groups, the 32-data compression circuit C32 used in common to all of the groups, and the first register Reg.1, the second register Reg.2, and the third Reg.3 used in common to all of the groups. In addition to the test circuit, the front-end interface 1003 includes circuit elements for communication with the controller 2000.

A back-end interface 1002 includes a writing circuit for accessing the memory cell 1001 to be tested, a charge transfer control circuit, a sense amplifier, and the like.

The controller 2000 comprises an interface with the exterior of the memory system. The controller 2000 is operable to control the entire system and also control the semiconductor device 1000. A control signal issuance circuit 2001 has a function of setting information in the first to third registers Reg.1-Reg.3 in addition to functions of sending well-known commands to the semiconductor device 1000 and of issuing an address signal or the like. The controller 2000 may also be used as the aforementioned tester device. In other words, the controller 2000 may include drives DV and drive-comparator units CP as described in connection with FIG. 2. In this case, the controller 2000 has a well-known function of a built-in self-test (BIST) circuit. The number of comparators in the BIST circuit can be reduced, and cost reduction (reduction of an area of the BIST circuit) can thus be achieved. Meanwhile, the aforementioned tester device may be connected to the exterior of the memory system. In such a case, the I/O bus of the system is connected to the external tester device with bypassing a data processing circuit 2002 of the controller 2000. Alternatively, the I/O bus of the system is connected directly to the tester device outside of the system via an external terminal (not shown). The command bus of the system is connected in the same manner as the I/O bus.

This system may be mounted on personal computers, electronic communication devices, electronic products for mobile units such as automobiles, industry-oriented electronic products, and consumer-oriented electronic products.

Although the present invention has been described with some embodiments or variations thereof, the fundamental technical concept of the present application is not limited to the aforementioned examples. For example, a semiconductor memory having an I/O compression test function has been described in the above examples. Nevertheless, the fundamental technical concept of the present application is not limited to such a semiconductor memory. For example, the present invention is generally applicable to semiconductor products having a memory function, such as a central processing unit (CPU), a micro control unit (MCU), a digital signal processor (DSP), an application specific integrated circuit (ASIC), and an application specific standard product (ASSP). In FIG. 9, for example, the semiconductor device 1000 (or 3000) may be replaced with CPU, MCU, DSP, ASSP, or the like as those functional devices also have a memory function. Thus, it should be understood that the technical concept of the present application is not limited to a memory system as a single functional product and is also effective in a system of a general electronic device having many I/Os. Specifically, the memory chips described in the above examples can be replaced with CPU chips, MCU chips, DSP chips, or ASSP chips. Furthermore, devices to which the present invention has been applied are applicable to semiconductor devices with technology including system-on-a-chip (SOC), multichip package (MCP), and package-on-package (POP). Moreover, transistors used may include a field effect transistor (FET) or a bipolar transistor. Various types of FETs including a metal oxide semiconductor (MOS), a metal-insulator semiconductor (MIS), and a thin film transistor (TFT) may be used for the transistors. The transistors may include transistors other than FETs and may partially include bipolar transistors. Furthermore, a P-channel transistor or a PMOS transistor is a typical example of a first conductive type of transistors, and an N-channel transistor or an NMOS transistor is a typical example of a second conductive type of transistors. Moreover, not only a P-type semiconductor substrate, but also an N-type semiconductor substrate may be used. A semiconductor substrate having a silicon-on-insulator (SOI) structure or other types of semiconductor substrates may be used.

Furthermore, the semiconductor device may include a plurality of stacked memory chips as shown in FIG. 11 or a plurality of memory chips arranged two-dimensionally in parallel as described in connection with FIG. 10.

Moreover, the circuit configuration of the switch circuits TSW8-0 to TSW8-3, the 8-data compression circuits C8-0 to C8-3, the 32-data compression circuit C32, and the like is not limited to the circuit configuration illustrated in the above examples.

Furthermore, the disclosed elements may be combined or selected in various ways within the scope of the appended claims of the present invention. In other words, the present invention includes a variety of variations and modifications that would be apparent to those skilled in the art from the entire disclosure and technical concept including the appended claims.

What is claimed is:

1. A semiconductor device comprising:
   a first chip and a second chip,
   wherein a plurality of I/O terminals of the first chip and a plurality of I/O terminals of the second chip are connected in common,
   each of the first and second chips includes:
      an I/O compression circuit operable to output a compression result obtained by compression of data of a plurality of internal data buses to a first I/O terminal of the plurality of I/O terminals in a test mode, and
      a test control circuit operable to control the I/O compression circuit, the test control circuit comprising a number setting register operable to set the number of the first I/O terminal of the plurality of I/O terminals so that the number of the first I/O terminal of the first chip is different from the number of the first I/O terminal of the second chip, and
   each of the first and second chips is operable to concurrently input data from or output data to an exterior or an interior of the semiconductor device in parallel so that different first I/O terminals are used in different chips with the I/O compression circuit activated in the test mode by the test control circuit.

2. The semiconductor device as recited in claim 1, wherein the first chip and the second chip are stacked on each other, the plurality of I/O terminals of the first chip and the plurality of I/O terminals of the second chip are connected in common via through electrodes of the first chip and the second chip.

3. The semiconductor device as recited in claim 1, wherein the I/O compression circuit includes:
   a logical circuit operable to receive a plurality of data of the plurality of internal data buses and to output the compression result in a reading mode of the test mode, and
   a first switch circuit that establishes electric conduction in the test mode, the first switch circuit being connected between the plurality of I/O terminals and an output node of the logical circuit.

4. The semiconductor device as recited in claim 3, wherein the I/O compression circuit includes a second switch circuit operable to electrically connect the output node of the logical circuit to a plurality of input nodes of the logical circuit in a writing mode of the test mode.

5. The semiconductor device as recited in claim 1, wherein the I/O compression circuit comprises a plurality of first I/O compression circuits corresponding to a plurality of groups into which the plurality of I/O terminals is divided, and
   each of the plurality of first I/O compression circuits includes:
      a first logical circuit operable to receive a plurality of data of the plurality of internal data buses corresponding to the plurality of groups and to output the corresponding compression result to the plurality of groups in a reading mode of the test mode, and
      a first switch circuit connected between the plurality of I/O terminals corresponding to the plurality of groups and an output node of the first logical circuit, the first switch circuit being operable to electrically connect the output node to one of the plurality of I/O terminals corresponding to the plurality of groups in the test mode.

6. The semiconductor device as recited in claim 5, wherein the first I/O compression circuit further includes a second switch circuit operable to electrically connect the output node of the first logical circuit to a plurality of input nodes of the first logical circuit in a writing mode of the test mode.

7. The semiconductor device as recited in claim 5, wherein the test control circuit further includes a compression ratio setting register operable to provide different compression ratios of the data,
   the I/O compression circuit includes:
      a second I/O compression circuit that realizes a first compression ratio of the plurality of I/O terminals, and
      the plurality of first I/O compression circuits that realize a second compression ratio lower than the first compression ratio, the plurality of first I/O compression circuits corresponding to the plurality of groups, the compression ratio setting register selecting one of the first compression ratio and the second compression ratio, and
   the second I/O compression circuit includes:
      a second logical circuit operable to receive a plurality of data of the plurality of internal data buses and to output the compression result in the reading mode of the test mode, and
      a third switch circuit connected between the plurality of I/O terminals and an output node of the second logical circuit, the third switch circuit being operable to electrically connect the output node of the second logical circuit to one of the plurality of I/O terminals in the test mode.

8. The semiconductor device as recited in claim 7, wherein the second I/O compression circuit further includes a fourth switch circuit operable to electrically connect the plurality of I/O terminals to the plurality of internal data buses, respectively, in a writing mode of the test mode.

9. A system comprising a semiconductor device and a controller connected to the semiconductor device via a command bus and an I/O bus, the semiconductor device comprising a first chip and a second chip,
   wherein a plurality of I/O terminals of the first chip and a plurality of I/O terminals of the second chip are connected in common,
   each of the first and second chips includes:
      an I/O compression circuit operable to output a compression result obtained by compression of data of a plurality of internal data buses to a first I/O terminal of the plurality of I/O terminals in a test mode, and
      a test control circuit operable to control the I/O compression circuit, the test control circuit comprising a number setting register operable to set the number of the first I/O terminal of the plurality of I/O terminals so that the number of the first I/O terminal of the first chip is different from the number of the first I/O terminal of the second chip, and
   each of the first and second chips is operable to concurrently input data from or output data to an exterior or an interior of the semiconductor device in parallel so that different first I/O terminals are used in different chips with the I/O compression circuit activated in the test mode by the test control circuit.

10. The system as recited in claim 9, wherein the first chip and the second chip are stacked on each other, the plurality of I/O terminals of the first chip and the plurality of I/O terminals of the second chip are connected in common via through electrodes of the first chip and the second chip.

11. The system as recited in claim 9, wherein the I/O compression circuit includes:
   a logical circuit operable to receive a plurality of data of the plurality of internal data buses and to output the compression result in a reading mode of the test mode, and
   a first switch circuit that establishes electric conduction in the test mode, the first switch circuit being connected between the plurality of I/O terminals and an output node of the logical circuit.

12. The system as recited in claim 11, wherein the I/O compression circuit includes a second switch circuit operable to electrically connect the output node of the logical circuit to a plurality of input nodes of the logical circuit in a writing mode of the test mode.

13. The system as recited in claim 9, wherein the I/O compression circuit comprises a plurality of first I/O compression circuits corresponding to a plurality of groups into which the plurality of I/O terminals is divided, and
   each of the plurality of first I/O compression circuits includes:
      a first logical circuit operable to receive a plurality of data of the plurality of internal data buses corresponding to the plurality of groups and to output the corresponding compression result to the plurality of groups in a reading mode of the test mode, and
      a first switch circuit connected between the plurality of I/O terminals corresponding to the plurality of groups and an output node of the first logical circuit, the first switch circuit being operable to electrically connect the output node to one of the plurality of I/O terminals corresponding to the plurality of groups in the test mode.

14. The system as recited in claim 13, wherein the first I/O compression circuit further includes a second switch circuit operable to electrically connect the output node of the first logical circuit to a plurality of input nodes of the first logical circuit in a writing mode of the test mode.

15. The system as recited in claim 13, wherein the test control circuit further includes a compression ratio setting register operable to provide different compression ratios of the data,
   the I/O compression circuit includes:
      a second I/O compression circuit for a first compression ratio of the plurality of I/O terminals, and
      the plurality of first I/O compression circuits for a second compression ratio lower than the first compression ratio, the plurality of first I/O compression circuits corresponding to the plurality of groups, the compression ratio setting register selecting one of the first compression ratio and the second compression ratio, and
   the second I/O compression circuit includes:
      a second logical circuit operable to receive a plurality of data of the plurality of internal data buses and to output the compression result in the reading mode of the test mode, and
      a third switch circuit connected between the plurality of I/O terminals and an output node of the second logical circuit, the third switch circuit being operable to electrically connect the output node of the second logical circuit to one of the plurality of I/O terminals in the test mode.

16. The system as recited in claim 15, wherein the second I/O compression circuit further includes a fourth switch circuit operable to electrically connect the plurality of I/O terminals to the plurality of internal data buses, respectively, in a writing mode of the test mode.

17. The system as recited in claim 9, wherein the controller has a function of setting the number setting register in the semiconductor device.

\* \* \* \* \*